(12) United States Patent
Cheng et al.

(10) Patent No.: US 9,703,164 B2
(45) Date of Patent: Jul. 11, 2017

(54) ARRAY SUBSTRATE AND DISPLAY DEVICE

(71) Applicant: Boe Technology Group Co., Ltd., Beijing (CN)

(72) Inventors: Hongfei Cheng, Beijing (CN); Jianbo Xian, Beijing (CN); Yong Qiao, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/914,036

(22) PCT Filed: Sep. 6, 2015

(86) PCT No.: PCT/CN2015/088973
§ 371 (c)(1),
(2) Date: Feb. 24, 2016

(87) PCT Pub. No.: WO2016/141696
PCT Pub. Date: Sep. 15, 2016

(65) Prior Publication Data
US 2017/0045793 A1   Feb. 16, 2017

(30) Foreign Application Priority Data
Mar. 9, 2015  (CN) ............... 2015 2 0132866 U

(51) Int. Cl.
*H01L 29/417*   (2006.01)
*G02F 1/1362*   (2006.01)
(Continued)

(52) U.S. Cl.
CPC ...... *G02F 1/136286* (2013.01); *G02F 1/1362* (2013.01); *G02F 1/1368* (2013.01);
(Continued)

(58) Field of Classification Search
CPC ............ H01L 27/124; H01L 29/41733; H01L 29/41775; G02F 1/136286; G02F 1/1368
See application file for complete search history.

(56) References Cited

U.S. PATENT DOCUMENTS

| 5,808,317 A | * | 9/1998 | Kuo ................. H01L 29/42384 257/401 |
| 2004/0125262 A1 | * | 7/2004 | Cho ..................... G02F 1/1368 349/43 |

(Continued)

FOREIGN PATENT DOCUMENTS

| CN | 103499907 | 1/2014 |
| CN | 104218019 | 12/2014 |
| CN | 204406009 | 6/2015 |

OTHER PUBLICATIONS

International Search Report and Written Opinion from PCT/CN15/88973 dated Dec. 16, 2016.

*Primary Examiner* — Earl Taylor
(74) *Attorney, Agent, or Firm* — Calfee, Halter & Griswold LLP

(57) ABSTRACT

The present invention discloses an array substrate and a display device. The array substrate comprises a data line and a gate line arranged crossly, a thin film transistor being arranged in vicinity of a cross position of the data line and the gate line, the thin film transistor comprising a gate and a source, the gate being connected with the gate line, the source being connected with the data line, an orthographic projection of the source on a base substrate of the array substrate partly overlapping with an orthographic projection of the gate on the base substrate of the array substrate. The array substrate provided by the present invention can reduce the parasitic capacitance generated between the source and (Continued)

the gate of the thin film transistor, thereby being capable of reducing delay of the gate line signal so as to improve the display quality.

10 Claims, 6 Drawing Sheets

(51) Int. Cl.
*G02F 1/1368* (2006.01)
*H01L 29/786* (2006.01)
*H01L 27/12* (2006.01)

(52) U.S. Cl.
CPC ...... *H01L 27/124* (2013.01); *H01L 29/41733* (2013.01); *H01L 29/41775* (2013.01); *H01L 29/786* (2013.01)

(56) References Cited

U.S. PATENT DOCUMENTS

| | | | |
|---|---|---|---|
| 2004/0125304 A1* | 7/2004 | Lee | G02F 1/134363 349/141 |
| 2004/0207784 A1* | 10/2004 | Lim | G02F 1/133555 349/114 |
| 2007/0115414 A1* | 5/2007 | Shin | G02F 1/134336 349/129 |
| 2009/0147169 A1* | 6/2009 | Kim | G02F 1/133502 349/43 |
| 2011/0133194 A1* | 6/2011 | Liu | H01L 27/124 257/59 |
| 2013/0277666 A1* | 10/2013 | Choi | H01L 27/1225 257/43 |
| 2014/0175423 A1* | 6/2014 | Jeong | H01L 29/66969 257/43 |
| 2014/0175424 A1* | 6/2014 | Choi | H01L 21/77 257/43 |
| 2015/0200208 A1* | 7/2015 | Lee | H01L 27/1225 257/43 |
| 2016/0035750 A1* | 2/2016 | Jeon | H01L 27/124 257/72 |
| 2016/0141378 A1* | 5/2016 | Yang | H01L 29/41733 257/43 |
| 2016/0172508 A1* | 6/2016 | Lee | H01L 27/1225 257/43 |
| 2016/0216555 A1* | 7/2016 | Kim | G02F 1/1362 |
| 2016/0293633 A1* | 10/2016 | Yang | H01L 27/124 |

\* cited by examiner

ARRAY SUBSTRATE AND DISPLAY DEVICE

RELATED APPLICATIONS

The present application is the U.S. national phase entry of PCT/CN2015/088973, with an international filing date of Sep. 6, 2015, which claims the benefit of Chinese Application No. 201520132866.8, filed on Mar. 9, 2015, the entire disclosures of which are incorporated herein by reference.

FIELD OF THE INVENTION

The present invention relates to the field of display technology, particularly to an array substrate and a display device comprising the array substrate.

BACKGROUND OF THE INVENTION

The liquid crystal display technology has been widely used in the fields of television, mobile phones, and public information display. At present, a liquid crystal display device mainly constitutes a cell assembling, an array substrate, and a color film substrate. Referring to FIG. 1, a schematic plane of an existing array substrate is illustrated. The array substrate comprises a gate line 10 and a data line 11. The gate line 10 and the data line 11 are perpendicularly crossed (because they are located in different layers, they will not be electrically connected where they are crossed) Moreover, a thin film transistor (comprising a gate 13, a source 14 and a drain 12) is arranged in the vicinity of the cross position of the gate line 10 and the data line 11. The signal voltage of the data line 11 is written into the pixel electrode through the thin film transistor.

The current array substrate inevitably has the following problems in actual applications:

As shown in FIG. 1, since the source 14 and the gate 13 of the thin film transistor overlap with each other, and the overlapping area is relatively large, a relatively large parasitic capacitance will be generated between the two, which makes the signal on the gate line 10 to be delayed, thereby resulting in cross talk and drop in display uniformity.

SUMMARY OF THE INVENTION

The object of the present invention lies in providing an array substrate and a display device, which can reduce the parasitic capacitance generated between the source and the gate of the thin film transistor, thereby being capable of reducing delay of the gate line signal so as to improve display quality.

In order to solve the above technical problem, as a first aspect of the present invention, the present invention provides an array substrate, comprising a data line and a gate line arranged crossly, a thin film transistor being arranged in vicinity of a cross position of the data line and the gate line, the thin film transistor comprising a gate and a source, the gate being connected with the gate line; the source being connected with the data line, wherein an orthographic projection of the source on a base substrate of the array substrate partly overlaps an orthographic projection of the gate on the base substrate of the array substrate.

Optionally, the orthographic projection of the source on the base substrate of the array substrate can be in a U shape, the U shape may comprise two end portions and a middle portion located between the two end portions. The two end portions may overlap with the orthographic projection of the gate on the base substrate of the array substrate; the middle portion does not overlap with the orthographic projection of the gate on the base substrate of the array substrate.

Further, the middle portion and the orthographic projection of the gate on the base substrate of the array substrate may form a closed region.

Optionally, the gate line comprises two branches connected in parallel with each other, with one of the two branches used as the gate. A gap may be formed between the orthographic projections of the two branches on the base substrate of the array substrate. The two end portions overlap with the orthographic projection of the branch used as the gate on the base substrate of the array substrate, with the middle portion located in the gap.

Optionally, the gate line comprises a gate portion used as the gate. The two end portions overlap with the orthographic projection of the gate portion on the base substrate of the array substrate; the middle portion does not overlap with the orthographic projection of the gate portion on the base substrate of the array substrate.

Further, the middle portion and the orthographic projection of the gate portion on the base substrate of the array substrate form a closed region.

Optionally, the orthographic projection of the source on the base substrate of the array substrate is in a U shape, the U shape comprising two end portions and a middle portion located between the two end portions. The two end portions overlap partly with the orthographic projection of the gate on the base substrate of the array substrate. The middle portion may overlap with the orthographic projection of the gate on the base substrate of the array substrate.

Optionally, the orthographic projection of the source on the base substrate of the array substrate is in a U shape, the U shape comprising two end portions and a middle portion located between the two end portions. The two end portions overlap with the orthographic projection of the gate on the base substrate of the array substrate, and the middle portion overlaps partly with the orthographic projection of the gate on the base substrate of the array substrate.

As a second aspect of the present invention, a display device is further provided, the display device comprising an array substrate and a cell assembling substrate arranged for assembling with the array substrate to form a cell. The array substrate can be any one of the above array substrates provided by the present invention.

The present invention has the following beneficial effects:

The array substrate provided by the present invention, by enabling the orthographic projection of the source of the thin film transistor on the base substrate of the array substrate to partly overlap with the orthographic projection of the gate of the thin film transistor on the base substrate of the array substrate, i.e., enabling the two to have a non overlapping portion, the parasitic capacitance generated between the source and the gate of the thin film transistor is reduced, thereby reducing delay of the gate line signal so as to improve display quality.

BRIEF DESCRIPTION OF THE DRAWINGS

The drawings are used for providing further understanding to the present invention, and constitute a part of the description, which are used for explaining the present invention together with the following detailed description of the invention. However, the drawings are for explanation purposes only and not to limit the present invention.

DETAILED DESCRIPTION OF THE INVENTION

Next, the detailed description of the invention will be explained in detail with reference to the drawings. It should be understood that the detailed description of the invention described here is only used for to explaining and present invention rather than being used for limiting the present invention.

The present invention provides an array substrate, comprising a data line and a gate line arranged crossly, a thin film transistor being arranged in vicinity of a cross position of the data line and the gate line, the thin film transistor comprising a gate and a source, wherein the gate is connected with the gate line. The source is connected with the data line; moreover, an orthographic projection of the source on a base substrate of the array substrate partly overlaps with an orthographic projection of the gate on the base substrate of the array substrate, i.e., the two have a non overlapping portion, thus it can reduce the parasitic capacitance generated between the source and the gate of the thin film transistor, thereby being capable of reducing delay of the gate line signal so as to improve the display quality.

Figure 1:
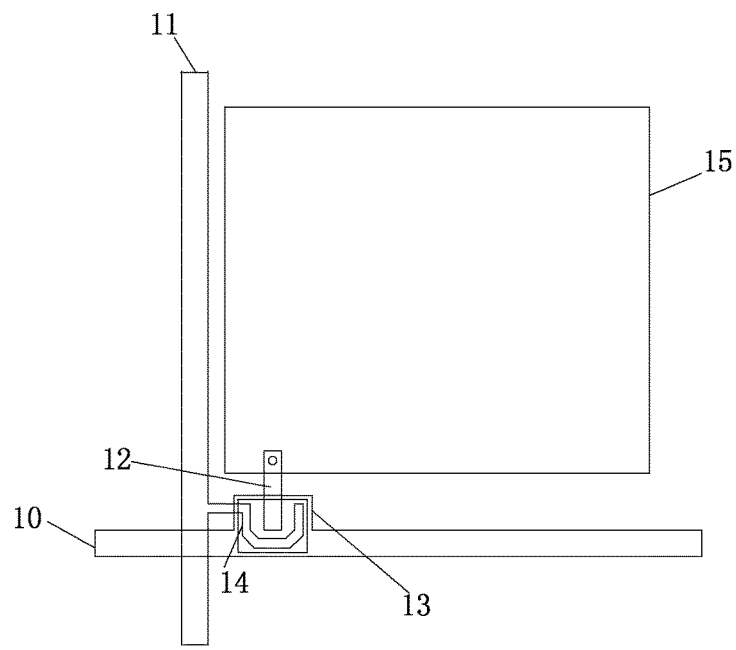
FIG. 1 is a schematic plane of an existing array substrate.
Figure 2A:
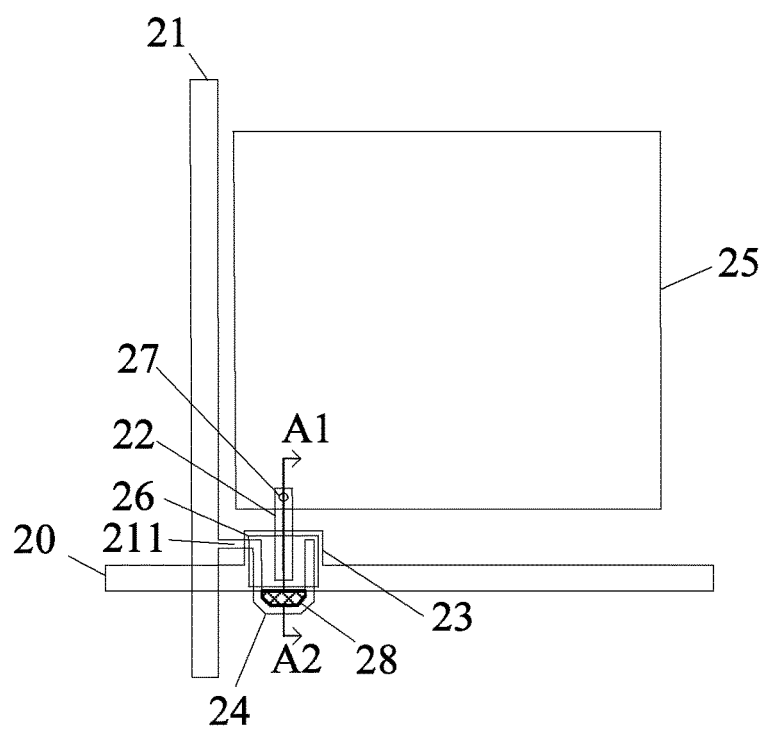
FIG. 2A is a schematic plane of an array substrate provided by a first embodiment of the present invention.
Figure 2B:
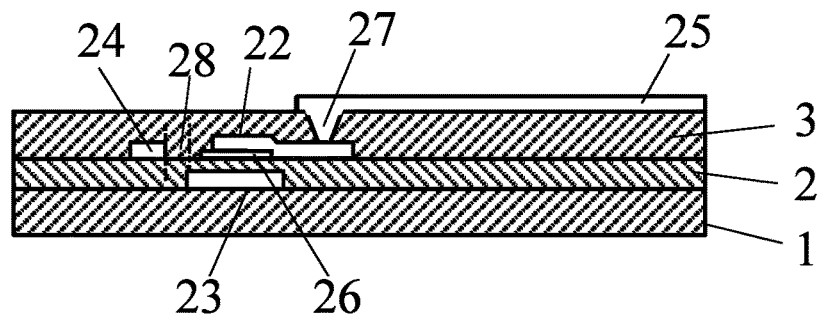
FIG. 2B is a sectional view along A1-A2 line in FIG. 2A.
Figure 2C:
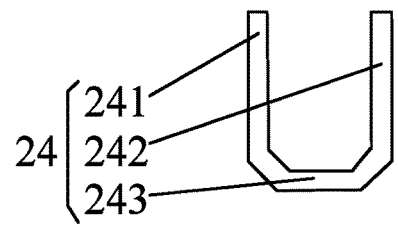
FIG. 2C is a schematic plane of a source used in the first embodiment of the present invention.

Next, the specific implementing mode in which the source partly overlaps with the gate will be described in detail. Specifically, FIG. 2A is a schematic plane of an array substrate provided by a first embodiment of the present invention. FIG. 2B is a sectional view along A1-A2 line in FIG. 2A. FIG. 2C is a schematic plane of a source used in the first embodiment of the present invention. Please refer to FIGS. 2A-2C together, the array substrate comprises a gate line 20 and a data line 21 arranged crossly and a pixel electrode 25, wherein a thin film transistor is arranged in vicinity of the cross position of the gate line 20 and the data line 21, the thin film transistor comprises a gate 23, a source 24 and a drain 22, wherein the drain 22 is electrically connected with the pixel electrode 25 through a via hole 27; the gate 23 is connected with the gate line 20, the gate 23 is a widened portion formed on the gate line 20. The source 24 is connected with the data line 21. Moreover, the array substrate further comprises a base substrate 1, a gate line insulating layer 2 and a passivation layer 3 arranged from bottom to up successively, the gate 23 is located between the base substrate 1 and the gate line insulating layer 2; the source 24 and the drain 22 are located between the gate line insulating layer 2 and the passivation layer 3, and an active layer 26 is further arranged at the bottom of the drain 22.

In this embodiment, as shown in FIG. 2C, the orthographic projection of the source 24 on the base substrate 1 of the array substrate is in a U shape. The U shape comprises two end portions 241, 241 and a middle portion 243 located between the two. Moreover, the source 24 is connected with the data line 21 through a connecting portion 211. The left end of the connecting portion 211 is connected with the data line 21, and the right end is connected with the end 241, as shown in FIG. 2A. Moreover, the two end portions 241, 242 overlap with the orthographic projection of the gate 23 on the base substrate 1 of the array substrate. The middle portion 243 does not overlap with the orthographic projection of the gate 23 on the base substrate 1 of the array substrate. This can reduce the parasitic capacitance generated between the source and the gate of the thin film transistor, thereby being capable of reducing delay of the gate line signal so as to improve the display quality.

In this embodiment, the middle portion 243 and the orthographic projection of the gate 23 on the base substrate 1 of the array substrate form a closed region 28, as shown in the shadow portion in FIG. 2A. The closed region 28 corresponds to a gap 28 between the source 24 and the gate 23 in FIG. 2B.

Figure 3:
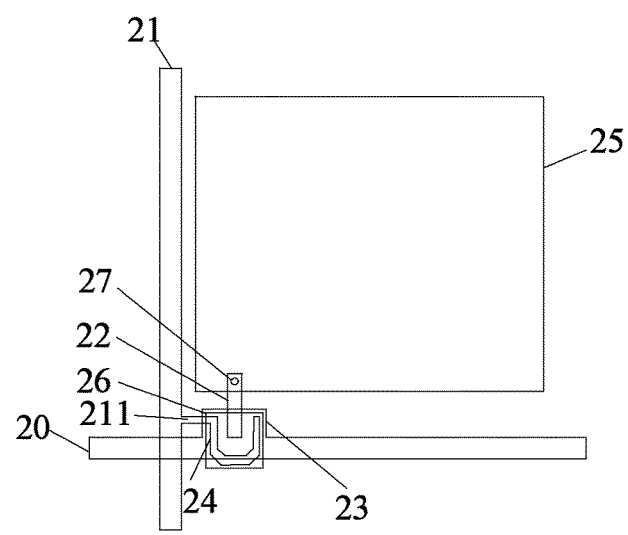
FIG. 3 is a schematic plane of an array substrate provided by a modified embodiment of the first embodiment of the present invention.

As a modified embodiment of the above first embodiment, FIG. 3 is a schematic plane of an array substrate provided by the modified embodiment of the first embodiment of the present invention. Referring to FIG. 3, the difference between this modified embodiment and the above first embodiment only lies in: the two end portions 241, 242 of the orthographic projection of the source 24 on the base substrate 1 of the array substrate overlap with the orthographic projection of the gate 23 on the base substrate 1 of the array substrate. The middle portion 243 of the orthographic projection of the source 24 on the base substrate 1 of the array substrate partly overlaps with the orthographic projection of the gate 23 on the base substrate 1 of the array substrate. That is to say, the middle portion 243 is located at the edge of the gate 23, thereby enabling the middle portion 243 to partly overlap with the orthographic projection of the gate 23 on the base substrate 1, while the above closed region 28 does not exist.

Figure 4A:
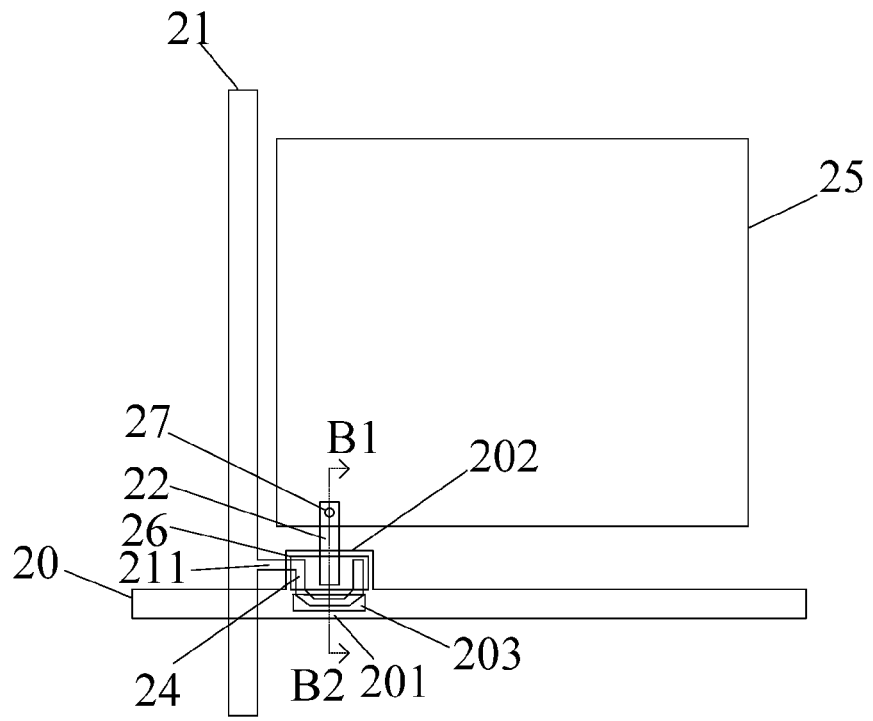
FIG. 4A is a schematic plane of an array substrate provided by a second embodiment of the present invention.
Figure 4B:
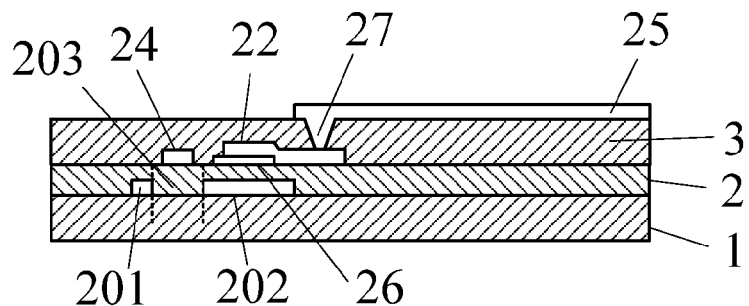
FIG. 4B is a sectional view along B1-B2 line in FIG. 4A.
Figure 4C:
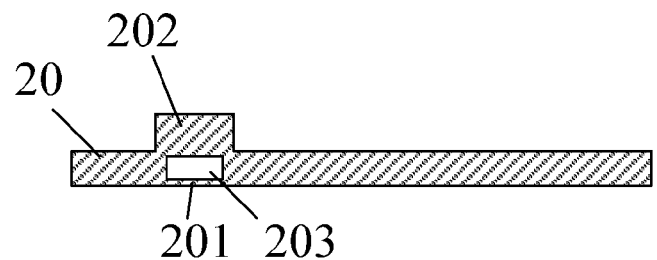
FIG. 4C is a schematic plane of a gate in FIG. 4A.
Figure 4D:
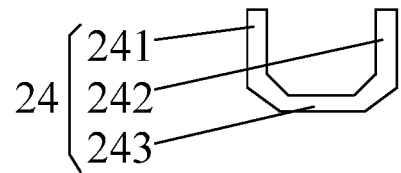
FIG. 4D is a schematic plane of a source used in the second embodiment of the present invention.

FIG. 4A is a schematic plane of an array substrate provided by a second embodiment of the present invention. FIG. 4B is a sectional view along B1-B2 line in FIG. 4A. FIG. 4C is a schematic plane of a gate line in FIG. 4A. FIG. 4D is a schematic plane of a source used in the second embodiment of the present invention. Please refer to FIGS. 4A-4D together, the difference between the array substrate provided by this embodiment and the above first embodiment lies in: the arrangement manner of the gate and the positional relationship between the gate and the source are different.

Specifically, in this embodiment, as shown in FIG. 4C, the gate line 20 comprises two branches 201, 202 connected in parallel with each other, a gap 203 is formed between the orthographic projections of the two branches 201, 202 on the base substrate 1 of the array substrate, wherein the branch 202 is used as the gate; the two end portions 241, 242 of the orthographic projection of the source 24 on the base substrate 1 of the array substrate overlap with the orthographic projection of the branch 202 used as the gate on the base substrate 1 of the array substrate; the middle portion 243 of the orthographic projection of the source 24 on the base substrate 1 of the array substrate is located in the gap 203, thereby enabling the middle portion 243 not to overlap with the orthographic projection of the gate 23 on the base substrate 1.

Figure 5A:
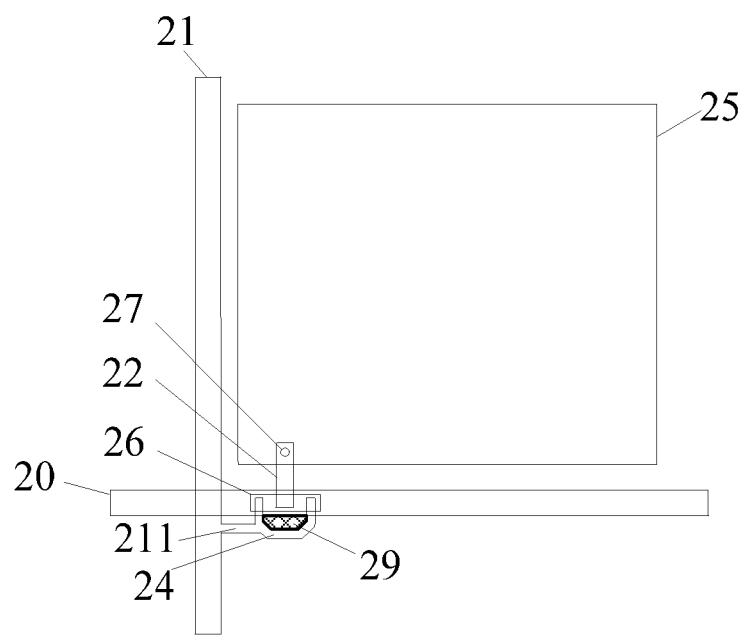
FIG. 5A is a schematic plane of an array substrate provided by a third embodiment of the present invention.
Figure 5B:
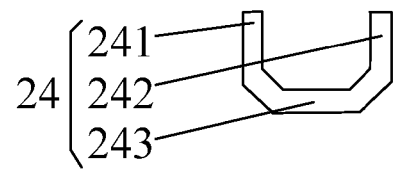
FIG. 5B is a schematic plane of a source used in the third embodiment of the present invention.

FIG. 5A is a schematic plane of an array substrate provided by a third embodiment of the present invention. FIG. 5B is a schematic plane of a source used in the third embodiment of the present invention. Please refer to FIGS. 5A and 5B together, the difference between the array substrate provided by this embodiment and the above first and second embodiments lies in: the arrangement manner of the gate and the positional relationship between the gate and the source are different.

Specifically, in this embodiment, as shown in FIG. 5A, the gate line 20 comprises a gate portion used as a gate, the gate portion is namely a segment on the gate line 20. Moreover, as shown in FIG. 5B, the orthographic projection of the source 24 on the base substrate 1 of the array substrate is in a U shape, the U shape comprises two end portions 242, 242 and a middle portion 243. Moreover, the source 24 is connected with the data line 21 through a connecting portion 211, the left end of the connecting portion 211 is connected with the data line 21, the right end is connected with the middle portion 243, as shown in FIG. 5A. Moreover, the two end portions 241, 242 of the orthographic projection of the source 24 on the base substrate 1 of the array substrate overlap with the orthographic projection of the gate portion on the base substrate 1; the middle portion 243 of the orthographic projection of the source 24 on the base substrate 1 of the array substrate does not overlap with the orthographic projection of the gate portion on the base substrate. In this embodiment, the middle portion 243 and the orthographic projection of the gate portion on the base substrate form a closed region 29, as shown in the shadow portion in FIG. 5A. Certainly, in actual applications, the middle portion can also overlap with the orthographic projection of the gate portion on the base substrate of the array substrate. That is to say, the middle portion is located at the edge of the gate portion, thereby enabling the middle portion to partly overlap with the orthographic projection of the gate portion on the base substrate, while the above closed region 29 does not exist.

Figure 6A:
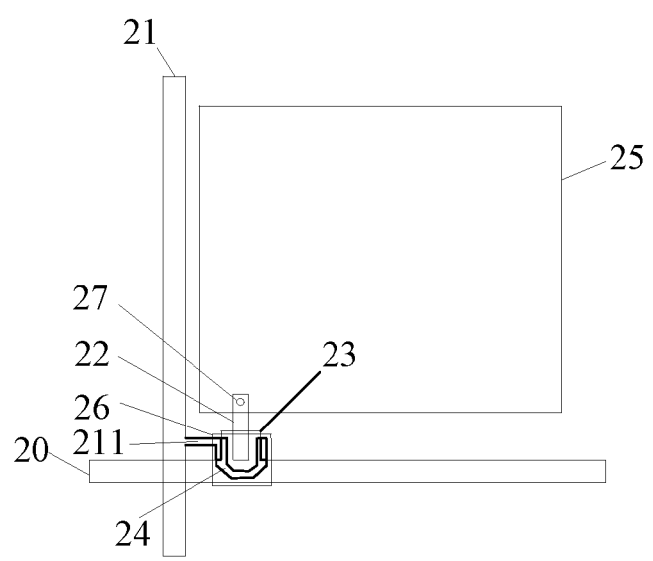
FIG. 6A is a schematic plane of an array substrate provided by a fourth embodiment of the present invention.
Figure 6B:
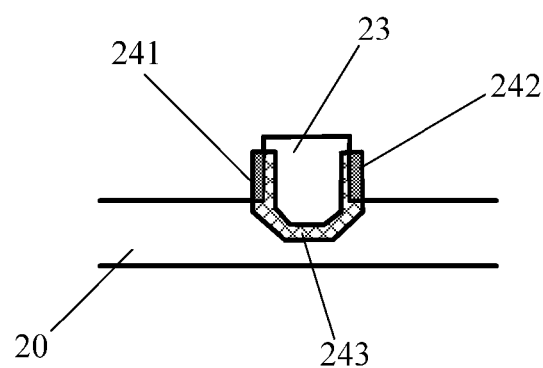
FIG. 6B is a schematic plane of a positional relationship between the source and the gate in FIG. 6A.

FIG. 6A is a schematic plane of an array substrate provided by a fourth embodiment of the present invention. FIG. 6B is a schematic plane of a positional relationship between the source and the gate in FIG. 6A. Please refer to FIGS. 6A-6B together, the difference between the array substrate provided in this embodiment and the above respective embodiments lies in: the arrangement manner of the gate and the positional relationship between the gate and the source are different.

The two end portions 241, 242 of the orthographic projection of the source 24 on the base substrate 1 of the array substrate partly overlap with the orthographic projection of the gate 23 on the base substrate 1 of the array substrate, i.e., a part of each of the two end portions 241, 242 is located at the external side of the left or right edge of the orthographic projection of the gate 23 on the base substrate 1 of the array substrate respectively; the middle portion 243 overlaps with the orthographic projection of the gate 23 on the base substrate 1 of the array substrate.

It should be noted that in the above respective embodiments, the orthographic projection of the source 24 on the base substrate 1 of the array substrate is in a U shape, however, the present invention is not limited to this. In actual applications, the orthographic projection of the source on the base substrate of the array substrate can also be in any other shapes, as long as it can overlap with the gate partly.

Figure 7:
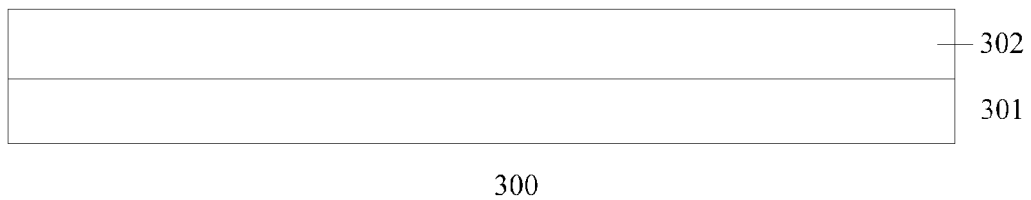
FIG. 7 is a schematic view of a display device provided by an embodiment of the present invention.

As another technical solution, an embodiment of the present invention provides a display device. As shown in FIG. 7, for example, a display device 300 comprises an array substrate 301 and a cell assembling substrate 302 arranged for assembling with the array substrate 301 to form a cell. The array substrate can be any one of the above array substrates provided by the present invention.

The display device provided by the present invention, by using the above array substrate provided by the present invention, can reduce the parasitic capacitance generated between the source and the gate of the thin film transistor, thereby being capable of reducing delay of the gate line signal so as to improve display quality.

The above implementing modes are only exemplary modes used for explaining the principle of the present invention. However, the present invention is not limited to these embodiments. For the ordinary skilled person in the art, various modifications and improvements can be made without departing from spirit and essence of the present invention. These modifications and improvements should also be regarded as the protection scope of the present invention.

The invention claimed is:

1. An array substrate, comprising a data line and a gate line arranged crossly, a thin film transistor being arranged in vicinity of a cross position of the data line and the gate line, the thin film transistor comprising a gate and a source, the gate being connected with the gate line; wherein the source is connected with the data line, wherein an orthographic projection of the source on a base substrate of the array substrate partly overlaps with an orthographic projection of the gate on the base substrate of the array substrate, and wherein the orthographic projection of the source on the base substrate of the array substrate is in a U shape, wherein the U shape comprises two end portions and a middle portion located between the two end portions, wherein the two end portions overlap with the orthographic projection of the gate on the base substrate of the array substrate; and wherein the middle portion does not overlap with the orthographic projection of the gate on the base substrate of the array substrate.

2. The array substrate according to claim 1, wherein the middle portion and the orthographic projection of the gate on the base substrate of the array substrate form a closed region.

3. The array substrate according to claim 1, wherein the gate line comprises two branches connected in parallel with each other, wherein one of the two branches is used as the gate, wherein a gap is formed between the orthographic projections of the two branches on the base substrate of the array substrate;

wherein the two end portions overlap with the orthographic projection of the branch used as the gate on the base substrate of the array substrate; and wherein the middle portion is located in the gap.

4. The array substrate according to claim 1, wherein the gate line comprises a gate portion used as the gate;

wherein the two end portions overlap with the orthographic projection of the gate portion on the base substrate of the array substrate; and wherein the middle portion does not overlap with the orthographic projection of the gate portion on the base substrate of the array substrate.

5. The array substrate according to claim 4, wherein the middle portion and the orthographic projection of the gate portion on the base substrate of the array substrate form a closed region.

6. A display device comprising an array substrate and a cell assembling substrate arranged for assembling with the array substrate to form a cell, wherein the array substrate is an array substrate according to claim 1.

7. The display device according to claim 6, wherein the middle portion and the orthographic projection of the gate on the base substrate of the array substrate form a closed region.

8. The display device according to claim 6, wherein the gate line comprises two branches connected in parallel with each other, wherein one of the two branches is used as the gate, wherein a gap is formed between the orthographic projections of the two branches on the base substrate of the array substrate; and wherein the two end portions overlap with the orthographic projection of the branch used as the gate on the base substrate of the array substrate;

the middle portion is located in the gap.

9. The display device according to claim 6, wherein the gate line comprises a gate portion used as the gate;

wherein the two end portions overlap with the orthographic projection of the gate portion on the base substrate of the array substrate; and wherein the middle portion does not overlap with the orthographic projection of the gate portion on the base substrate of the array substrate.

10. The display device according to claim 9, wherein the middle portion and the orthographic projection of the gate portion on the base substrate of the array substrate form a closed region.

* * * * *